US005994975A

United States Patent [19]

Allen et al.

[11] Patent Number: 5,994,975

[45] Date of Patent: Nov. 30, 1999

[54] MILLIMETER WAVE CERAMIC-METAL FEEDTHROUGHS

[75] Inventors: Barry R. Allen; Randall J. DuPrey, both of Redondo Beach; George G. Pinneo, Manhattan Beach; Daniel T. Moriarty, El Segundo, all of Calif.

[73] Assignee: TRW Inc., Redondo Beach, Calif.

[21] Appl. No.: 09/067,217

[22] Filed: Apr. 28, 1998

[51] Int. Cl.[6] ........ H03H 5/00

[52] U.S. Cl. ........ 333/26; 174/152 GM; 333/206; 333/245; 439/935

[58] Field of Search ........ 333/26, 244, 245, 333/99 R, 206; 439/559, 935; 174/152 R, 152 GM, 50.56, 50.58, 50.61

[56] References Cited

U.S. PATENT DOCUMENTS

| | | | |
|---|---|---|---|
| 2,212,725 | 8/1940 | Andres | 174/152 R |
| 3,109,054 | 10/1963 | Kuhnapfel et al. | 439/935 X |
| 4,174,145 | 11/1979 | Oescheger et al. | 439/935 X |
| 4,678,868 | 7/1987 | Kraska et al. | 174/152 GM |
| 4,757,292 | 7/1988 | Basil, Jr. et al. | 333/244 |
| 5,223,672 | 6/1993 | Pinneo et al. | 174/152 GM X |
| 5,267,684 | 12/1993 | Cathelina et al. | 174/152 GM X |
| 5,557,074 | 9/1996 | Miyamoto et al. | 174/152 GM |

*Primary Examiner*—Paul Gensler
*Attorney, Agent, or Firm*—Michael S. Yatsko; Ronald M. Goldman

[57] ABSTRACT

A durable, broad-band low insertion loss RF feedthrough is formed of a straight conductor (5) centrally supported by, hermetically sealed to and axially extending through the center of a strong, rigid, impervious ceramic disk (3). The ceramic disk is hermetically sealed, directly or indirectly, to the metal barrier (11) through which the feedthrough is to propagate RF energy. The new ferrule and ferrule-less ceramic metal RF feedthroughs avoid the use of glass, conventional in existing feedthroughs. The novel feedthrough serves as the principal element of a microwave microstrip line to waveguide transition.

13 Claims, 4 Drawing Sheets

MILLIMETER WAVE CERAMIC-METAL FEEDTHROUGHS

FIELD OF THE INVENTION

This invention relates to RF feedthroughs, the short length of rigid RF transmission lines that pass RF energy through a barrier, and, more particularly, to an RF feedthrough for low-loss propagation of low power millimeter wave RF energy from millimeter wave RF electronic device package housings. The invention also relates to microwave strip line to waveguide transitions.

BACKGROUND

Solid state electronic devices, such as integrated circuits, are often housed in closed metal-walled containers or packages. The package is typically hermetically sealed and protects the electronic devices from the external environment, which sometimes contains radiation, corrosive gases or other material harmful to the confined electronic device. RF feedthroughs are used to carry RF signals through the package's metal wall between the package interior and exterior for connection to external devices. In essence, the feedthrough is a very short RF transmission line and is the conventional means to propagate RF energy through an RF barrier, such as a metal wall.

Typically feedthroughs have been constructed of glass and metal, the glass, referred to as a glass bead, located in a hole in the package wall, serves as an insulating support and dielectric that maintains a straight metal pin, the transmission line conductor, in insulated relationship with the metal package walls and as an impervious barrier to the external environment. In some instances, a single glass bead may support multiple pins.

Glass-to-metal feedthroughs of various sizes, shapes, and pin configurations have been known to the industry for over fifty years. Such feedthroughs have been formed directly within the metal wall of the package, where the wall is constructed of a nickel, cobalt and iron material, such as Kovar. They have also been constructed within a tubular ferrule of Kovar for later assembly into the package wall. The Kovar ferrule is inserted within a cylindrical aperture in the package's metal wall and soldered in place to form a relatively impervious seal.

Glasses that are highly resistive to attack by atmospheric gases, such as $H_2O$ vapor and carbon dioxide, chemical fumes and industrial vapors are well known. One such type of glass is borosilicate glass, such as Corning 7052, a Kovar matched glass having thermal expansion characteristics closely matched to that of Kovar, Corning 7070, a Tungsten matched glass, both marketed by the Corning Company, and Kimble EN-1 marketed by the Kimble company.

In the feedthrough's construction borosilicate glass is reflowed between the central metal pin, typically a pin formed of Kovar material, and the outer ferrule. In reflowing, the melted glass forms a glass meniscus about a portion of the pin's length. Upon hardening the glass forms a strong environmental seal that resists moisture, oxidation and other harmful chemicals that might attack the integrated circuits.

A measure of the feedthrough's integrity is obtained by subjecting the feedthrough to a hermetic leakage test. In that test helium gas is placed in the sealed metal package or other enclosure in which the feedthrough has been mounted and a helium mass spectrometer type leak detector is used to detect the rate at which Helium atoms pass through the glass to metal seals, due to a defect in the glass. An acceptable package according to industry standards is one that has a helium leak rate of less than $1\times10^{-8}$ ATM-cc/sec. He, no matter how many feedthroughs the package contains. A good individual seal should have a leak rate no greater than $1.0\times10^{-10}$ ATM-cc/sec. He.

The performance of the borosilicate glass-to-metal feedthroughs has been well demonstrated in the industry. Presently, microelectronic packages using those feedthroughs are routinely fabricated having Helium leak rates of only $1\times10^{-10}$ atm cubic centimeters per second.

Despite its effectiveness, glass-to-metal seals suffer a drawback. They are not durable. The glass is brittle. If the feedthrough's glass encased metal pin is deflected, bent or deformed during handling or testing, glass particles are broken at the glass meniscus surrounding the pin. That breakage compromises the integrity of the feedthrough. In some cases, radial cracks or circumferential cracks appear in the glass. Those cracks might be due to differences in thermal expansion characteristics between the glass and the pin, or some form of fatigue or from other causes, which remain unknown.

However, once even a small crack appears, the crack may propagate with repeated thermal cycling as occurs during normal use of the electronic apparatus containing the package. Once crack propagation occurs, mechanical movement of the package or mechanical stresses resulting from handling, shipping, aircraft or spacecraft vibration may aggravate the cracks and the feedthrough begins to noticeably leak. Atmospheric gases may then enter the package and damage the internal integrated circuits. Even if the initial crack in the glass does not penetrate the glass seal, the crack can expose a good portion of the length of the metal pin. When that occurs, subsequent chemical attack may corrupt the remaining portion of the pin and, ultimately, breach the seal and destroy the package integrity. Being aware of the glasses fragility, those skilled in fabricating devices containing those RF feedthroughs necessarily take extra care in handling to ensure the integrity of the product. One might hope for a more dynamic and cost efficient assembly process as would be possible if the glass seals did not require such careful handling.

In addition to its fragility, the glass seal structure is more "lossy" in its electrical characteristics than one would desire, principally due to the use of Kovar material for the central pin. Kovar is a poor electrical conductor; it is made acceptable in the glass feedthrough only by plating the exposed portion of the pin's exterior surface with higher conductivity metals, such as a layer of Nickel followed by an overlayer plating of Gold. Unfortunately, in order to form the hermetic glass-to-metal seal, the Kovar must be oxidized at those portions that are to contact the glass to allow wetting by the borosilicate glasses. That oxide surface further compromises the glass feedthrough's electrical conductivity, forcing significant restriction of current passing through the feedthrough's glass bead portion.

The pin's conductivity is dependent upon the "skin effect", described in the transmission line literature and well-known to RF engineers. That effect forces most of the current to flow essentially along the exterior surface of electrical conductors, with the electrical fields extending only a short depth below the surface. Because of that phenomenon, gold, which is highly conductive, plated on another conductor, such as Kovar, provides an excellent conduit for conduction. At RF frequencies above 20 Ghz, the skin effect is more pronounced, concentrating the RF fields at the surface and a minute depth into the conductor. Because the Kovar pin is plated with a layer of Gold, the bulk of the RF transmission takes place principally in and along the Gold plating and not significantly in the underlying highly resistive Kovar. For that reason it is permissible to use Kovar material as part of an RF transmission medium without the RF signal encountering significant resistive losses. However, in the glass to metal seal, only the portions of the Kovar pin that lie outside the glass bead may be gold plated to enhance the pin's electrical conductivity. The central portion of the Kovar pin that fits through the glass bead, however, cannot be Gold plated for the reason earlier stated and, therefore, compromises the electrical conductivity of the transmission path. The glass-to-metal feedthrough thus exhibits low electronic efficiency.

Accordingly, a principal object of the present invention is to improve the electronic efficiency of RF feedthroughs by enhancing the feedthrough's electrical conductivity.

A further object of the invention is to provide RF feedthroughs that are physically more hardy and durable than the glass-to-metal type by eliminating glass from the feedthrough structure.

A still further object of the invention is to provide a new feedthrough structure that may employ metals of higher electrical conductivity than Kovar.

An additional object of the invention is to increase the efficiency with which RF feedthroughs may be installed in electronic equipment.

A still additional object of the invention is to provide a glass-less RF feedthrough that has a helium leak rate of less than $1\times10^{-10}$ atmospheres cubic centimeters per second and is of greater durability than the glass-to-metal type feedthroughs.

And an ancillary object of the invention is to provide a new feedthrough structure whose center pin may be bent or straightened as desired, without damaging the feedthrough's hermetic seal.

SUMMARY OF THE INVENTION

In accordance with the foregoing objects, an improved RF feedthrough is constructed of metal and ceramic, entirely eliminating glass. The ceramic-to-metal feedthrough is characterized by a metal pin, a metal flange surface collaring the pin and integral therewith, a washer shaped disk of strong non-glass dielectric material, such as alumina ceramic, with the central aperture disk allowing extension of the pin there through but not the flange surface. In one embodiment constructed in accordance with the invention, the ceramic disk is provided with a metalized inner rim on one side for soldering to the flange surface, and a metalized outer rim on an opposed side for soldering to another metal flange surface of a metal ferrule or cylindrical cavity formed in a metal package wall.

The metal pin may be formed of any of the higher conductivity metals, those having a conductivity greater than that of Kovar material. Alternative embodiments may use silver, copper, molybdenum, brasses, and with unlimited budget, even gold for the feedthroughs center-conductor. Solder or braze seals can be effected with continuously plated higher conductivity metals with no central unplated regions, such as is required with Kovar in glass-metal seals. In less preferred embodiments a Kovar pin that is plated with a highly conductive material, such as Gold may be used.

With the foregoing feedthrough, efficient broadband feedthrough transmission of millimeter wave signals is achieved with lower insertion loss and high return loss than available from a glass-to-metal feedthrough and greater durability achieved by a feedthrough of ceramic-to-metal construction.

In accordance with a secondary aspect to the invention, the foregoing feedthrough structure serves as the principal element of a novel microwave microstrip line to waveguide transition. In that transition, a microwave launcher element is integrally attached to or formed on the end of the feedthrough's center pin to form a unitary one piece assembly. The new transition permits a waveguide to be mounted directly over the launcher element, permitting a more compact assembly.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DETAILED DESCRIPTION OF THE PREFERRED EMBODIMENTS

Figure 1:
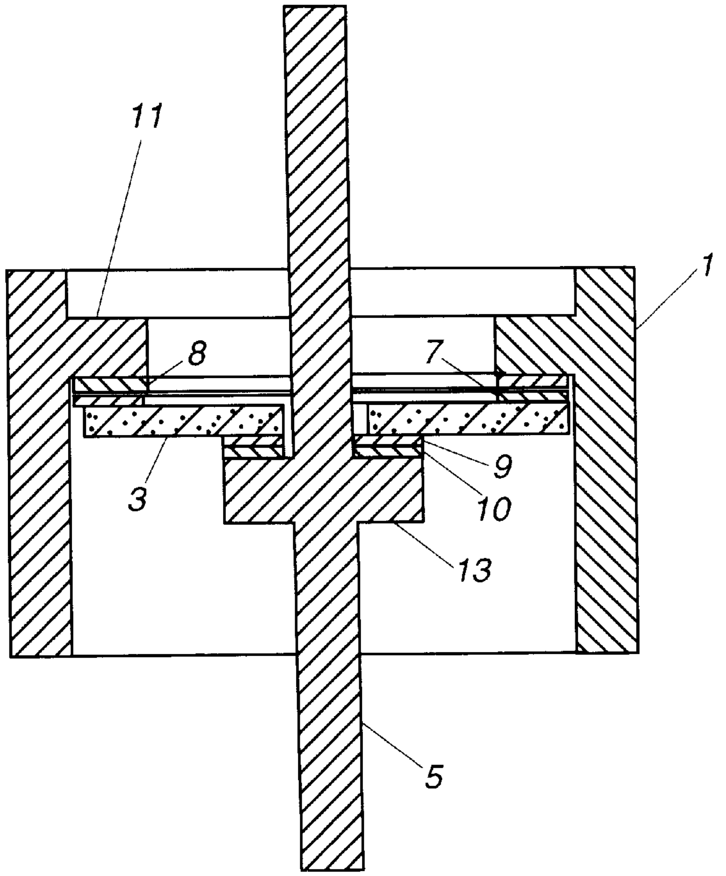
FIG. 1 illustrates an embodiment of the invention in section view.

An embodiment of the RF feedthrough constructed in accordance with the invention is illustrated in a not-to-scale section view in FIG. 1 to which reference is made. To avoid misunderstanding, it may be initially noted that the term RF, originally an acronym used just for radio frequency, as used herein as part of the term RF feedthrough, is herein intended to encompass all of the frequencies of electromagnetic energy used for not only radio, but for radar as well. The term encompasses not only the low, high and very high frequencies found in the energy spectrum, but also the microwave and millimeter wave frequencies as well. In a practical application being considered by the present applicants for the feedthrough, the RF used is of 50 Gigahertz, a frequency that falls in the millimeter wave region of the energy spectrum.

The feedthrough of FIG. 1 contains a metal ferrule 1, ceramic disk 3, and a metal pin 5 assembled together as illustrated, suitably by brazing and/or soldering. Ferrule 1 is essentially a hollow cylinder in geometry, containing a radially inwardly projecting annular ledge 11 of a predetermined thickness. The ledge projects from the inner cylindrical wall of the ferrule at a right angle to the ferrule's axis. Although somewhat constricting the axial passage through the ferrule, the circular rim of ledge 11 leaves a relatively wide cylindrical passage centered on the ferrule's central axis. Suitably the ferrule is formed of Kovar.

Pin 5 is formed of an electrically conductive metal, such as copper, molybdenum, silver or brass, as supports propagation of RF with low resistive loss. In less preferred embodiments the pin may be formed of Kovar that is plated with gold. Pin 5 contains an integral annular flange portion 13 positioned about midway along the pin's length that extends radially outward a short distance from the smaller diameter cylindrical surface that makes up the principal portion of the pin's length. The flange serves as a collar encircling the more slender shaft and, as more specifically described hereinafter, as a bonding surface. In this embodiment, the conducting pin is greater in length than the axial length of ferrule 1, leaving the pin ends extending beyond the ends of the ferrule. That allows external electrical coaxial RF connectors to more easily access the front and/or back ends of the pin, when the feedthrough is placed in service.

Disk 3 is washer-shaped in geometry, is of a predetermined thickness, and contains a small cylindrical passage through the center, through which pin 5 protrudes. That small cylindrical passage is sufficient in diameter to permit the slender cylindrical portion of pin 5 to pass through, but is too small to permit passage of the pin's flange 13, the latter of which essentially abuts against the disk. The disk supports the pin in the central position in the assembly coaxial of the ferrule's metal walls and electrically insulates the pin from those metal walls.

Disk 3 is constructed of a low-loss dielectric material that is rigid, impervious to gas and strong, such as Beryllium Oxide, quartz materials, Silicon dioxide, cordierite, and, preferably, alumina. The selected material also possesses a well-understood thermal expansion characteristic and the metal elements described are selected to match that thermal expansion characteristic as closely as the technology permits. Any resulting forces as may result from a slight difference in thermal expansion characteristic between the elements is taken up by the strength of the materials forming the elements, including the strength of the dielectric disk.

To assist in brazing or soldering the elements together to disk 3 into the unitary assembly illustrated, a narrow ring of metallizing material 7 is deposited and bonded along the outer periphery on the upper surface of disk 3, and a second narrow ring of metallizing material 9 is deposited and bonded along the bottom surface of the ceramic disk bordering the central circular passage through the disk. These metallizing rings are formed using conventional technique on disk 3 prior to assembling the disk into the ferrule. Solder or braze metal preforms, 8 and 10, are pre-shaped and placed between the metallized surfaces of the disk and body. By raising the temperature to the respective eutectic temperatures, the elements are bonded together.

Those skilled in the art may notice that pin 5 could also be bonded to the disk through use of soldering or brazing material that is placed on the cylindrical wall of the central passage in disk 3. However, that is a less reliable structure and is more difficult to manufacture. Although falling within the scope of the present invention, the latter alternative is a less preferred manner of construction.

It is appreciated that the elements of the RF feedthrough form an integral assembly that is impervious to gas and provides a hermetic barrier between the front and rear sides thereof. The foregoing feedthrough structure provides a DC electrical connection through pin 5 and, hence, may alternatively be used to pass DC currents in addition to RF, a conventional feature of feedthroughs. In operation, RF energy applied to one end of pin 5 propagates to the other end of the pin and to an electrical RF connector, which, in practice, is connected to that end of the pin and permits the RF to propagate through and be distributed to external circuits, ideally with maximum power transfer.

Figure 2:
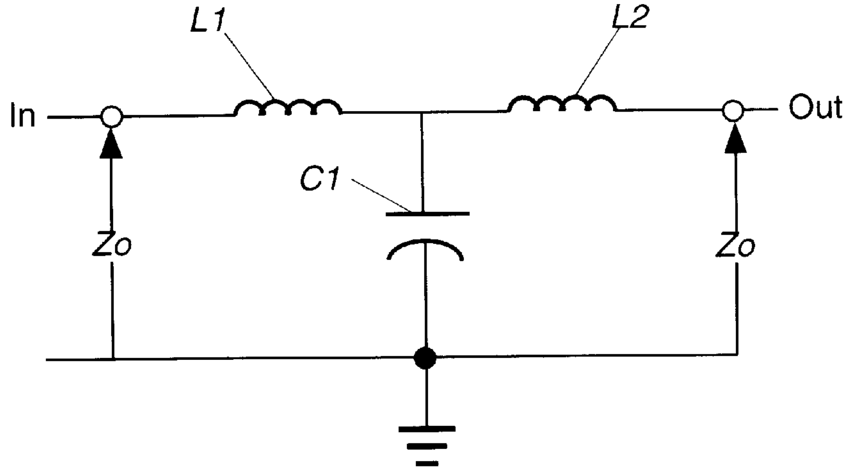
FIG. 2 is an electrical schematic illustration of the embodiment of FIG. 1.

Those skilled in the art of microwave and RF transmission lines, particularly coaxial transmission lines, recognize that the foregoing mechanical assembly defines a short coaxial line that possesses certain electrical RF characteristics. Those characteristics may be further simplified and represented schematically as a simple single section low pass filter, formed of two inductances and a capacitance, such as schematically illustrated in FIG. 2. Schematically, the feedthrough is presented in the form of a "T" low pass filter in which the self- inductance of the coaxially arranged walls of the ferrule and surface of the pin to one side of the disk is represented by L1 and that on the other side of the disk by L2. The capacitance provided by the disk is represented by C1. The capacitance provided by the air dielectric between the metal elements being so much less than that of the disk, is disregarded in the schematic. The inductance of the disk and region is also insignificant and is disregarded.

Because the feedthrough is to propagate RF energy between its terminals over a range of frequencies, the structure of the feedthrough should be "broadband" in characteristic or, as otherwise stated, have the lowest possible voltage standing wave ratio, VSWR, over a broad band of frequencies. This means that the parasitic inductances, L1 and L2, and the parasitic capacitance, C, should be minimized, while proportioned so that their effects cancel one another.

Although rigid, strong and impervious to gas, the alumina in the foregoing feedthrough possesses a high dielectric constant, $\epsilon_r$, producing a capacitance to electrical ground potential, which is excessive in amount. To compensate for that additional shunt capacitance, the transmission circuit through the feedthrough must contain sufficient inductance. Generally speaking, that inductance may be increased by increasing the length of the pin. Inductance may also be increased by changing the diameter of a portion of the pin to provide a shorter circumference and/or be further from the metal cylindrical inner wall of the ferrule. Likewise to increase that inductance the inner diameter of the ferrule may be increased to place that wall further from the surface of the pin. Although the mathematical formulae available in the technical literature offers a general guide to establishing proper dimensions and spacing between the transmission line elements, from that guide, testing and simulations are desired to provide a more accurate result.

For maximum RF power transfer between transmission lines the lowest voltage standing wave ratio, VSWR, occurs when the connecting transmission lines or waveguides have the same characteristic impedance, $Z_0$ at the principal frequency of interest, such as 50 GHz by way of example. Thus the low pass filter should have the same characteristic impedance at its input as the transmission line which, in application, is connected to it, i.e., the input end of pin 5. Likewise the output impedance of that formed low pass filter should match the transmission line that, in application, is to be connected to it, i.e., the output end of pin 5. As an example, the external transmission lines contemplated for use with a practical embodiment of the RF feedthrough typically have characteristic impedances of about 50 ohms, and, hence, the input and output of the RF feedthrough is designed to have the same impedance value.

The effects of the parasitic impedances of ceramic disk 3 and flanges 11 and 13 may be minimized with appropriate geometries, resulting in the minimal VSWR over the widest bandwidth. Further reduction in VSWR for narrower bandwidths may then be accomplished by adding lengths of low or high impedance regions machined into the housing adjacent to the ceramic feedthrough region at the input and/or at the output.

In the intended application for the foregoing feedthrough, the metal package wall in which the feedthrough is to be installed is pre-drilled to form the appropriate cylindrical hole or passage that matches the size and shape of the ferrule's outer surface. The ferrule is then inserted into the passage and soldered or brazed in place, forming a hermetic seal between the ferrule and the wall.

In a practical embodiment of FIG. 1 for operation at 50 GHz. the diameter of the shaft of pin 5 is 0.009 inches and the pin's length is 0.155 inches overall. The flange or collar 13 is 0.030 inches in diameter and its thickness is 0.010 inches. The narrow cylindrical passage in the ferrule is also 0.021 inches in diameter while the larger passage portion is 0.049 inches in diameter. The alumina disk is 0.010 inches thick and is just under 0.120 inch in its outer diameter. The central aperture in the disk is just sufficient to permit clearance of the 0.009 inch diameter portion of the pin.

Figure 3:
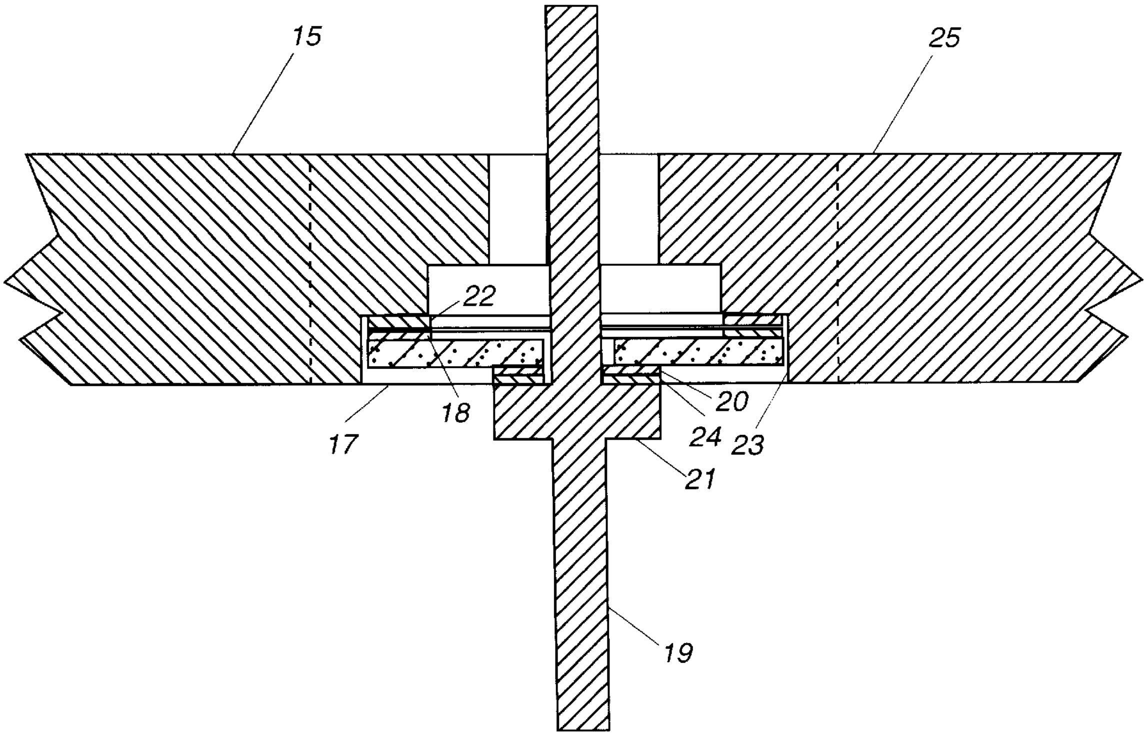
FIG. 3 illustrates a second embodiment of the invention in section view.

Should one desire to forego the convenience of a drop-in feedthrough, the invention may be incorporated directly into the wall of the package or housing, an alternative which falls within the scope of the present invention, such as illustrated in the partial section view of FIG. 3 to which reference is made. In this embodiment, the "ferrule" 15 with its shaped inner walls (and simulated outer walls represented by the dash lines in the figure) in essence is formed integrally with the package's metal wall as a unitary one-piece assembly. Alternatively this embodiment may be looked upon as a "ferrule-less" RF feedthrough.

As is apparent from the illustration, the elements in this embodiment have counterparts to the elements in the preceding embodiment. This includes metal wall 25, suitably of gold-plated Kovar material, which provides the same structural features as ferrule 1 in the preceding embodiment, disk 17, formed of a strong, rigid, dielectric material, such as alumina, and metal pin 19, formed of gold-plated Kovar, assembled in the permanent relationship illustrated with portions of the pin 19 extending in front of and behind metal wall 15. The pin also contains the integral annular collar 21.

As in the preceding embodiment, disk 17 contains metalization rings 18 and 20, illustrated in a larger scale than the remaining elements, respectively bordering the outer edge of the upper surface and the inner circular edge of the bottom surface. For final assembly, preform solder rings, 22 and 24, also illustrated in a larger scale, suitably an 80/20 gold tin composition, placed between the metalization and the annulus in the inner wall, and the other between the lower metalized disk surface and the upper annular portion of collar 21. With the elements pressed together the assembly is heated and the temperature is raised to the eutectic temperature of the solder and the solder re-flows. Upon removal of the heat, the solder solidifies and firmly bonds the elements together, electrically and mechanically.

To simplify the fabrication of the shaped opening while maintaining adequate inductance and other desirable RF characteristics required of the feedthrough, the inner walls of the passage are stepped in shape. Thus three pill or disk-shaped shaped openings are formed one atop the other and together form the passage. The first step is wide enough to seat disk 17 and contains an annular step against which to bond the upper edge surface of the disk. These stepped diameters are designed to provide an optimum RF coaxial structure when combined with the given pin 19 and disk 17.

Figure 5:
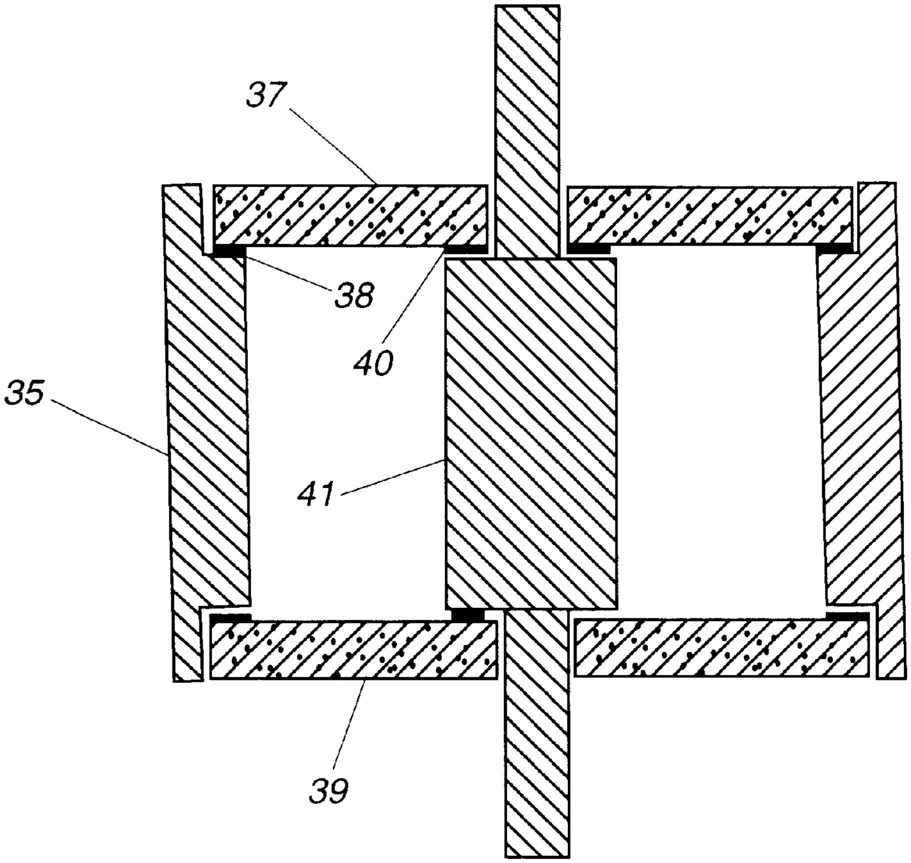
FIG. 5 pictorially illustrates a fourth embodiment of the invention in section view.

Another embodiment of the invention incorporates two alumina disks as illustrated in the partial section view of FIG. 5. This feedthrough contains a cylindrical ferrule 35 formed of gold-plated Kovar material, a pair of washer shaped dielectric disks, 37 and 39, suitably formed of alumina and a "rolling pin" shaped or stepped cylindrical metal pin 41, formed of gold plated Kovar.

The ferrule contains an inner annular ledge at each of its front and back ends to support the outer peripheral edges of the alumina disks 37 and 39. The disks are identical in structure. Each contains a central cylindrical opening or passage sufficient to allow the smaller cylindrical ends of pin 41 to project through the respective disk passages, but not the larger diameter portion. Each disk contains a pair of metalization rings on one of the surfaces: One ring, 38, borders the outer edge of the disk and the other ring 40 borders the central passage.

Pin 41 includes an annular shaped step at each end that forms the transition between the small diameter "handle" portion of the rolling pin shape and the larger diameter "rolling pin" portion of pin 41. Upon assembly, the respective annuluses are soldered to the adjacent inner metalization rings on the adjacent ceramic disks. The outer metalization rings on the disks are soldered to the respective ledges on ferrule 35. The soldering effectively hermetically seals the feedthrough.

Figure 6:
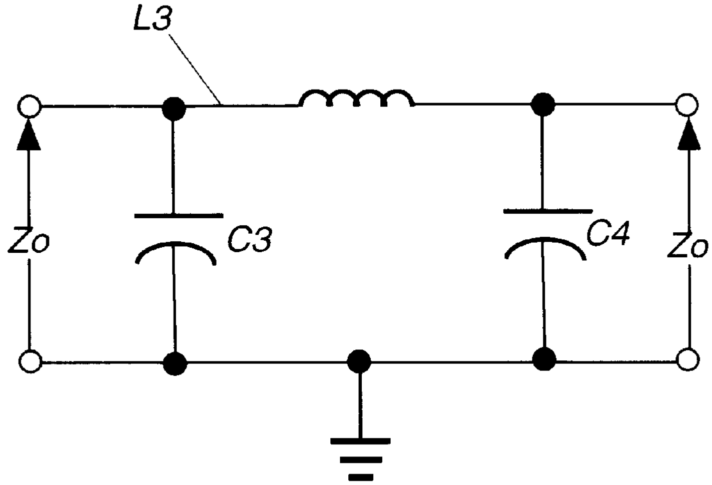
FIG. 6 is an electrical schematic illustration of the embodiment of FIG. 5.

The RF coaxial transmission line represented by the foregoing feedthrough construction may be represented schematically by the "Pi" configured low pass filter illustrated in FIG. 6. In this figure L3 represents the inductance of the feedthrough and C3 and C4 represent the capacitances introduced by the dielectric disks. The capacitance due to air insulation between the inner and outer conductors being much less than that from the disks may be disregarded.

In the foregoing embodiments, alumina was used as the dielectric material. However other dielectric materials that are also strong, rigid and relatively impervious to gases, capable of being metalized and brazed or soldered to the metal selected for the ferrule and center pin and having sufficiently close thermal expansion characteristics to those metals, may be substituted. Some such dielectric materials include sapphire, single crystal quartz, cordierite, and beryllia.

As those skilled in the art appreciate, when another insulating material having a dielectric constant different from alumina is substituted for alumina, it is necessary to change the dimensions of the metal elements, adding or reducing inductance, as appropriate, in order to preserve the relationship between the capacitive and inductive impedances as will maintain the desired characteristic impedance at the input and output ends of the feedthrough.

Other high conductivity metals may be substituted in the pin for gold plated Kovar, such as, but not limited to, copper, brass or Molubdenum.

The lower,the surface resistivity of the metal, the lower is the insertion-loss created in the feedthrough. A good insertion loss is one that is less than 0.2 dB. Of the identified metals, copper is the most conductive and least resistive. Hence, with copper pins, the feedthrough would have the best insertion-loss figure, that is, the least insertion loss. However Kovar, though more resistive, possesses a thermal expansion characteristic that is more closely matched to the thermal expansion characteristic of the alumina, than is copper. However, to be useful in the foregoing feedthroughs, the Kovar must be plated with a more highly conductive metal. For greater durability in situations in which the RF feedthrough undergoes large temperature variations, Kovar thus offers the better compromise and more preferred choice. Where wide temperature variations are not expected, then an intrinsically highly conductive, that is, less resistive metal, such as copper, is the preferred choice, in that pin 15 is less expensive to manufacture.

In the foregoing description, the word "integral" is used in connection with the description of the ledge on the ferrule and the collar on the pin. The term is used in the sense that the cited component is formed with the respective element to which it is attached in one piece defining a unitary one-piece assembly.

The foregoing feedthrough structure may be easily adapted to an additional function, namely a microstrip to waveguide transition, by the addition of a "launcher" to an end, which couples to a microwave mode that can propagate in the waveguide. Such a launcher may be formed of conductive metal in the shape of a cross or tee or may be formed as an enlarged cylinder or cap, both of which are known waveguide coupling devices.

Figure 7:
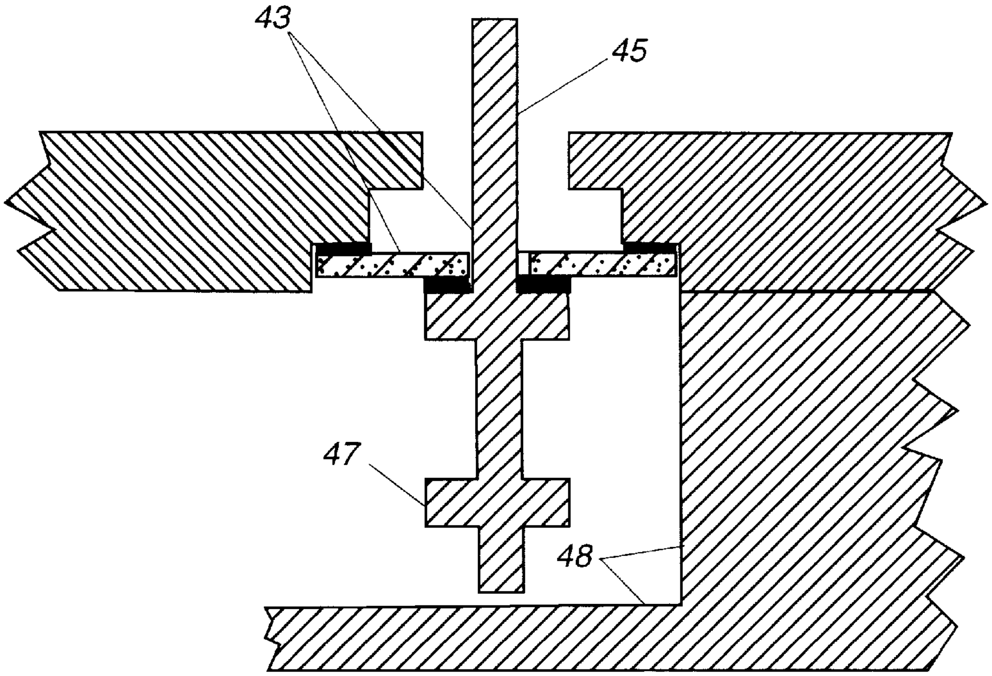
FIG. 7 illustrates an embodiment of a microstrip line to waveguide transition formed in part with the preceding embodiments.

As pictorially illustrated in FIG. 7, to which reference is made, a feedthrough 43, constructed in accordance with any of the foregoing embodiments, includes a conductive metal pin 45. The "T"-shaped metal member, which serves as the launcher, is inverted and attached to the end of pin 45, forming an integral assembly. In application the feedthrough is installed within the wall of an electronic assembly and in that installation the bottom end of pin 45 is connected directly or indirectly to a microwave microstrip line formed on a substrate. At the other end of pin 45 containing launcher 47, a rectangular waveguide, 48, is inserted over the launcher. Essentially the launcher 47 is inserted through an opening in the wall of the waveguide and, as is conventional, is placed at a location within the waveguide where the launcher couples microwave energy to the electric fields of the dominant microwave mode for the waveguide.

Figure 8:
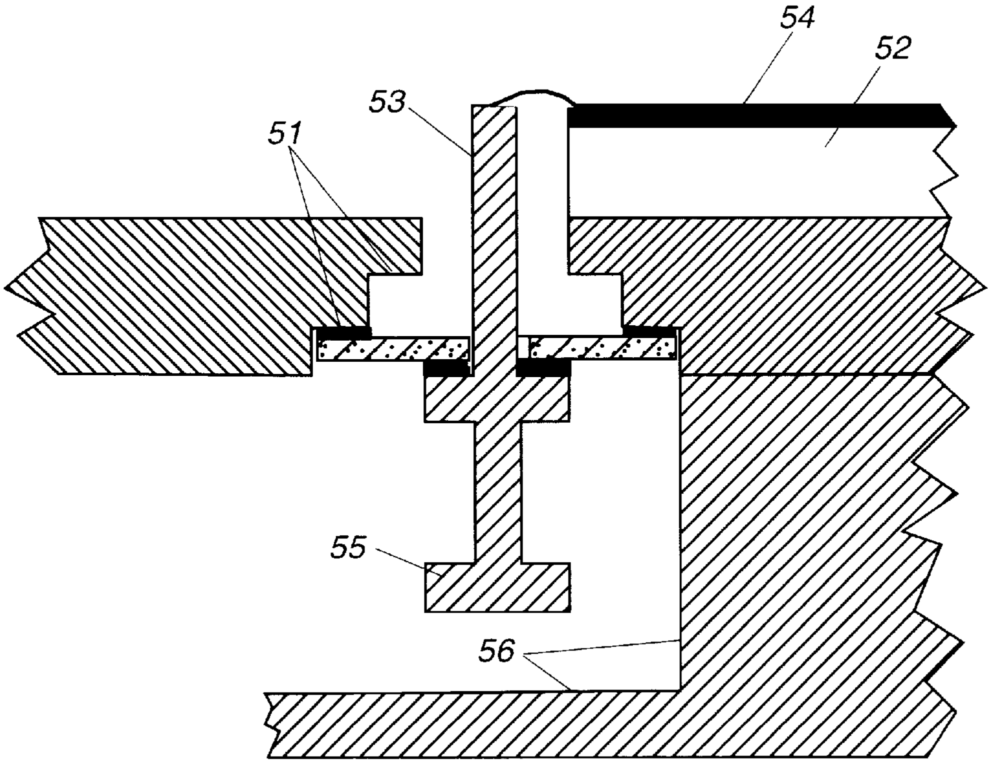
FIG. 8 illustrates a second embodiment of a microstrip to waveguide transition in section view.

FIG. 8 pictorially illustrates a corresponding stripline to waveguide transition which uses the second mentioned launcher of cylindrical geometry. Thus feedthrough 51, includes center conductive metal pin 53. The conductive metal cylinder 55, defining the launcher is integrally attached to one end of pin 53, while the opposed end of the pin is for connection to a microstrip line. As in the prior case, a rectangular waveguide 56 is placed over launcher 55 and the latter is positioned there within to couple to a dominant mode. At its other end pin 53 is connected to a microwave microstrip line 54 formed on a side of a circuit board substrate 52.

The latter two structures combine the benefits of the new feedthrough construction and an integral microstrip to waveguide transition.

Figure 4:
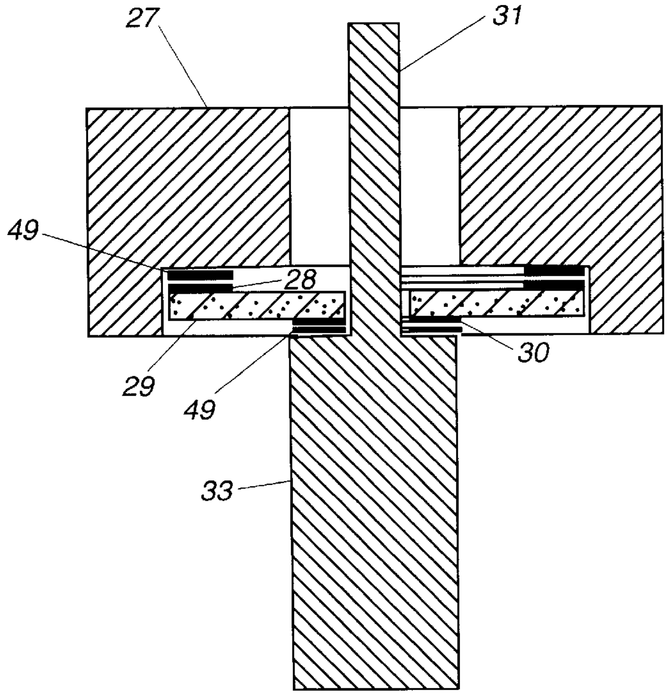
FIG. 4 pictorially illustrates a third embodiment of the invention in section view.

An embodiment of a microwave microstrip line to waveguide transition is presented in partial section view in FIG. 4 to which reference is made. From the prior description one recognizes the elements of the single disk feedthrough construction. This also contains a ferrule 27, an alumina disk 29, containing metalization rings 28 and 30, and gold-plated Kovar pin 31. For additional construction details of the assembly and alternatives, the reader may refer back to the description of FIGS. 1 and 3, which are not repeated. In this embodiment, the inner cylindrical wall of the ferrule contains a single step, with a wide diameter portion sufficient to seat the disk, and a smaller diameter portion spaced from the slender portion of the cylindrical surface of pin 31.

Instead of a collar, pin 31 has an enlarged diameter cylindrical portion 33 at the bottom end in the figure that is integral with the pin's shaft. That enlarged diameter portion is a microwave launcher from which microwaves may be coupled into rectangular waveguide and is formed in one piece with feedthrough pin. The surface formed in pin 31 as a result of the step up in diameter to the enlarged diameter portion 33 is bonded to the metalization band on the disk with an 80/20 gold-tin alloy preform ring. The disk in turn is bonded to the circular step surface in ferrule 27, also with an 80/20 gold-tin alloy preform ring.

Ideally, feedthroughs of the forgoing construction are useable over a frequency range from DC to 50 GHz. They are broadband in characteristic; that is, about the principal frequency at which they are designed for use, they exhibit a impedance characteristic that is relatively flat or constant over a frequency range extending above the principal frequency by at least ten percent and below the principal frequency by the same percentage. More specifically at a frequency of 44 GHz, the bandwidth should extend from 40 GHz to 48 GHz.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. In an RF feedthrough containing a hollow cylindrical metal wall, an elongate metal pin and means connected between said cylindrical metal wall and said pin for supporting said pin coaxially within said cylindrical metal wall, the improvement wherein said means comprises: at least one disk of strong, rigid, non-porous dielectric material; said disk comprising a washer-shaped geometry with a central cylindrical passage; said pin extending through said central cylindrical passage in said disk; and said disk being hermetically sealed to both said cylindrical metal wall and said pin, and wherein said pin further includes integral therewith a radially outwardly extending collar member located at a predetermined position along the length of said pin and extending circumferentially thereabout, said collar member having an outer diameter greater in size than the diameter of said central cylindrical passage through said disk, wherein said collar abuts said disk and prevents movement of said pin through said disk; and wherein said disk is hermetically sealed to said collar member.

2. The invention as defined in claim 1, wherein said disk comprises the material alumina.

3. The invention as defined in claim 1, wherein said cylindrical metal wall includes integral therewith a radially inwardly projecting annular ledge located at a predetermined position from an end of said wall; and wherein said disk is hermetically sealed to said annular ledge.

4. The invention as defined in claim 3, further comprising:

a first annular ring of metallizing material circumferentially extending about and bonded to a surface of said disk;

a second annular ring of metallizing material bordering said central cylindrical passage and bonded to a surface of said disk;

a first ring-shaped solder or braze pre-form overlying said first annular ring for bonding said metallizing ring to said ledge; and a second ring-shaped solder or braze pre-form overlying said second annular ring for bonding said second metallizing ring to said collar member.

5. The invention as defined in claim 4, wherein said disk comprises a material selected from the group consisting of: sapphire, single crystal quartz, cordierite, and beryllium oxide.

6. The invention as defined in claim 3, further comprising:

a first annular ring of metallizing material circumferentially extending about and bonded to a surface of said disk;

a second annular ring of metallizing material bordering said central cylindrical passage and bonded to a surface of said disk;

and said first annular ring being bonded to said ledge to form a hermetic seal and said second annular ring being bonded to said collar member to form a hermetic seal.

7. The invention as defined in claim 6 wherein a means for bonding each of said annular rings to the respective ledge and collar member comprises braze material or solder.

8. The invention as defined in claim 6, wherein said disk comprises the material alumina.

9. The invention as defined in claim 6, wherein said elongate metal pin comprises a material selected from the group consisting of: molybdenum, silver, copper, brass and a gold-plated Nickel-Cobalt alloy.

10. The invention as defined in claim 6, wherein said disk comprises a material selected from the group consisting of: sapphire, single crystal quartz, cordierite, and beryllium oxide.

11. The invention as defined in claim 10, wherein said elongate metal pin comprises a material selected from the group consisting of: molybdenum, silver, copper, brass and a gold-plated Nickel-Cobalt alloy.

12. In an RF feedthrough containing a hollow cylindrical metal wall, an elongate metal pin and means connected between said cylindrical metal wall and said pin for supporting said pin coaxially within said cylindrical metal wall, the improvement wherein said means comprises: at least one disk of strong, rigid, non-porous dielectric material; said disk comprising a washer-shaped geometry with a central cylindrical passage; said pin extending through said central cylindrical passage in said disk; and said disk being hermetically sealed to both said cylindrical metal wall and said pin; and further comprising: microwave launcher means integrally attached to an end of said pin for coupling microwave energy to a waveguide said microwave launcher means comprising a "T"-shaped geometry.

13. An RF feedthrough comprising:

a hollow cylindrical metal wall;

an elongate metal pin and means connected between said cylindrical metal wall and said pin for supporting said pin coaxially within said cylindrical metal wall;

said means comprising: at least one disk of strong, rigid, non-porous dielectric material and a washer-shaped geometry with a central cylindrical passage;

said pin extending through said central cylindrical passage said disk;

said pin further including integral therewith a radially outwardly extending collar member located at a predetermined position along the length of said pin and extending circumferentially thereabout, said collar member having an outer diameter greater in size than said central cylindrical passage in said disk, wherein said collar member abuts said disk and prevents movement of said pin through said disk;

said disk being hermetically sealed to both said cylindrical metal wall and said pin;

said cylindrical metal wall including integral therewith a radially inwardly projecting annular ledge located at a predetermined position from an end of said wall;

a first annular ring of metallizing material circumferentially extending about and bonded to a surface of said disk;

a second annular ring of metallizing material bordering said central opening and bonded to a surface of said disk;

a first ring shaped solder or braze pre-form overlying said first annular ring for bonding said metallizing ring to said ledge to form a hermetic seal therewith; and a second ring shaped solder or braze pre-form overlying said second annular ring for bonding said second metallizing ring to said collar member to form a hermetic seal therewith;

said strong, rigid, non-porous dielectric material comprising a material selected from the group consisting of:

alumina, sapphire, single crystal quartz, cordierite, and beryllium oxide; and said elongate metal pin comprising a material selected from the group consisting of: molybdenum, silver, copper, brass and a gold-plated Nickel-Cobalt alloy.

* * * * *